United States Patent [19]
Elliott et al.

[11] Patent Number: 4,535,232
[45] Date of Patent: Aug. 13, 1985

[54] METHOD OF BIASING A PHOTOCONDUCTIVE DETECTOR AND DETECTOR APPARATUS THEREFOR

[75] Inventors: Charles T. Elliott; Anthony M. White; Howard J. Field, all of Malvern, England

[73] Assignee: The Secretary of State for Defence in Her Britannic Majesty's Government of the United Kingdom of Great Britain and Northern Ireland, London, England

[21] Appl. No.: 441,863

[22] Filed: Nov. 15, 1982

[30] Foreign Application Priority Data

Dec. 7, 1981 [GB] United Kingdom ................ 8136752

[51] Int. Cl.³ .............................................. H01J 40/14
[52] U.S. Cl. ................................. 250/206; 250/214 R
[58] Field of Search ............ 250/214 R, 211 J, 211 K, 250/211 R, 578, 338, 332, 206; 307/311; 357/30

[56] References Cited

U.S. PATENT DOCUMENTS

| 3,700,905 | 10/1972 | Parkin et al. ............... 250/211 K X |
| 3,891,843 | 6/1975 | Parkin ........................ 250/338 R X |
| 3,924,150 | 12/1975 | Wasa et al. ......................... 307/311 |
| 700838 | 12/1953 | United Kingdom. |
| 840095 | 7/1960 | United Kingdom. |
| 2002511 | 12/1953 | United Kingdom. |

Primary Examiner—Edward P. Westin
Attorney, Agent, or Firm—Cushman, Darby & Cushman

[57] ABSTRACT

It is a problem extracting the photosignal component from detector output, to the exclusion of pedestal bias response. To overcome this, a time varying bias signal is applied to each element of the detector. The duration of the time varying bias signal, or if a periodic signal, the signal period, is chosen as long compared to photocarrier lifetime and the signal amplitude is large enough to range over a non-linear portion of the responsivity characteristic of each element. The bias signal contains a d.c. component so that the bias signal ranges about a point of operation—a point of asymmetry lying on the responsivity characteristic. The photosignal component of the output signal may be removed by time averaging or by harmonic separation. Alternatively the bias signal may be modulated, and the photosignal component extracted by detection of demodulated signal.

20 Claims, 5 Drawing Figures

METHOD OF BIASING A PHOTOCONDUCTIVE DETECTOR AND DETECTOR APPARATUS THEREFOR

TECHNICAL FIELD

This invention concerns photoconductive detector biassing and detector apparatus; in particular detector apparatus including: a detector comprising at least one photoconductive element; a bias source, connected to the detector, for applying bias to each element of the detector; and, an output circuit, connected to each element, responsive to an electrical output signal from each element, to extract from each electrical output signal a photoresponse signal dependent on the intensity of radiation incident upon each element; and, in particular a method of biassing a photoconductive detector wherein bias is applied to each element of the detector and a photoresponse signal dependent on radiation intensity is extracted from the output signal developed by each element.

Photoconductive detectors, particularly those sensitive to infra-red radiation, have been considered for use in imaging applications. They may also find application in future laser communication and laser rangefinding systems.

BACKGROUND ART

Conventional photoconductive detectors comprise one or more square elements of photosensitive material, each element having a pair of spaced bias contacts. For imaging applications, such a detector is placed in the image plane of an optical assembly and is usually shielded to reduce the incidence of background illumination upon the detector. The detector is usually mounted on a cold stage and is cooled to enhance signal-over-noise discrimination. In one form of conventional detector apparatus using intrinsic photoconductive elements responsive to the middle and far-infra-red region of the spectrum, a steady direct current (DC) bias, from a constant current source, is applied to each element. There is thus developed across each detector element a bias pedestal voltage, a voltage dependent on bias current magnitude and element resistance. When radiation of appropriate wavelength is incident upon the detector elements, photoresponse signals—in this case photovoltages—are developed and these increment the voltage provided by each element. The incremental photoresponse signal voltage is, for normal radiation intensities, of magnitude several orders smaller than the magnitude of the bias pedestal, and it is usual to back-off each element voltage by subtracting DC voltage to allow extraction and amplification of the photosignal. However, to be wholly effective the back-off voltage applied, in each case, must follow changes in the pedestal voltage. Such changes may occur, for example, as a result of cold stage temperature drift, of change in ambient temperature, of change of average background illumination, and of bias current drift. Such pedestal voltage changes are in general also orders of magnitude higher than the photosignal increment. Furthermore the pedestal voltage and the change of this voltage will vary from element to element. In general the resistance of each element will differ, since material resistivity and element dimensions vary within manufacturing tolerance. Because of non-uniformity in the bias pedestal, it is in the very least difficult, if not impractical, in unscanned, so called "staring" systems, to back off element voltage satisfactorily so that the wanted illumination dependent photoresponse signal can be extracted without the introduction of an unacceptable degree of fixed pattern noise. It is also possible to operate these detectors using constant voltage drive bias instead of constant current in which case device current is measured. This too requires bias compensation, and this likewise introduces fixed pattern noise.

Because of these difficulties, progress in photoconductive detector development is impeded and this development is giving way to the alternative development of photovoltaic detectors, albeit this latter involves a more complex, generally more expensive and less far advanced technology.

Alternative to the use of DC bias, experimental use of microwave frequency alternating current bias has been reported in the literature (A. S. Sommers Jr, Microwave biassed photoconductive detector, Chapter 11 (page 435) Semiconductors and Semimetals Vol 5, Eds Willardson and Deer (Academic Press) 1970). The DC responsivity (ie voltage increment for unit intensity of radiation of appropriate wavelength) of a photoconductive element is limited by photocarrier recombination losses occurring at the bias contacts. However, using very high frequency alternating bias as reported, it is possible to reduce these forced recombination losses, since the flow direction of the photocarriers can be reversed before many of the photocarriers reach the bias contacts. In this case the photocarrier density is limited instead by natural recombination losses in the element material bulk, these carriers recombining within a natural average lifetime. Much higher linear responsivity (AC) is claimed to be attained. However, as reported, the detector is biassed in the microwave field of a tuned microwave resonant cavity. Such apparatus is complex, difficult to set up accurately, and is expensive. So far as is known, such apparatus has not been applied commercially. The principle merit is that it allows the photoconductor to be biassed at high fields without suffering the consequential effects of carrier loss at the contacts. The developed photoresponse signal and bias response however are both linear and suffer the same fixed pattern noise problem.

DESCRIPTION OF THE INVENTION

This invention is intended to provide a remedy for the above-mentioned problems. The present invention provides both a method of biassing and a detector apparatus which allow for the extraction of a useful illumination dependent photoresponse signal from an element signal.

According to the invention there is provided a method of biassing a photoconductive detector characterised in that the bias applied is of time varying amplitude and has such peak amplitude as to range over a substantially non-linear portion of the responsivity characteristic of each element of the detector, the bias amplitude varying in a time that is significantly longer than the photocarrier lifetime.

It is convenient to use as bias, an alternating bias or a bias having an alternating component—eg an alternating current applied at a finite dc current level, or an alternating voltage superimposed on a finite dc voltage.

The useful photoresponse signal component of the resulting element signal may be extracted by harmonic separation. However, provided that the bias alternates about a point of operation lying on the responsivity characteristic of each element, above and below which point the responsivity changes by different degree—and this is so if the bias applied has both an alternating component and a finite dc component—the photoresponse signal component of the element signal may instead be extracted by rectification.

In further accordance with the invention, there is provided detector apparatus for performing the method above described, the apparatus being characterised by a bias source arranged to apply a cyclic bias having both an alternating component and a finite dc component, the bias having such peak amplitude as to range over a substantially non-linear portion of the responsivity characteristic of each element of the detector, and the bias having a cycle period significantly longer than the photocarrier lifetime.

A useful signal may be extracted by means of a filter arranged to pass the dc signal. The dc signal is induced by the non-linear function of the detector which is itself induced by incident illumination.

Alternatively, a useful signal may be extracted as an harmonic of the frequency of the alternating bias, using a high pass filter or phase sensitive circuit. The filtered harmonic can also be subsequently converted to a dc signal by simple rectification.

In preference to the foregoing, however, it can be advantageous to apply, as the alternating component of the bias, an amplitude modulated alternating bias, and to extract the wanted signal as a demodulation signal, using a low pass filter to block the signal at the higher alternating frequency (ie the carrier frequency of the bias) and to pass the signal at the modulation frequency. Since modulation and carrier frequencies with well chosen separation can be utilised, the extraction filter design can accordingly be much simplified.

The detector may be used to receive modulated radiation, and accordingly the filter design can be chosen appropriately.

As discussed in the description that follows hereinafter, when using current bias, the preferred value of DC bias current may be somewhat lower than that of DC current bias ordinarily applied, and is such as to produce a bias field E, a factor between 0.5 and 0.7 of the sweep-out bias field $E_o$ ordinarily applied:

$$0.5E_o \leq E \leq 0.7E_o \text{ and preferably } E = 0.6E_o$$

where the ordinary bias field $E_o$ is given by the relation:

$$\mu_a E_o \tau / l = 1$$

$\mu_a$: being the photocarrier ambipolar mobility;
$\tau$: the natural lifetime of the photocarriers; and,
$l$: the contact-to-contact spacing of each element.

The preferred value of AC bias current peak amplitude also optimally corresponds to a peak amplitude bias field E, a factor between 2.0 and 4.0 of the DC bias field E:

$$2.0E \leq E \leq 4.0E \text{ and preferably } E = 3.0E.$$

In this way the peak envelope power dissipation necessary to produce best performance can be minimised.

DESCRIPTION OF THE PREFERRED EMBODIMENT

Figure 1:
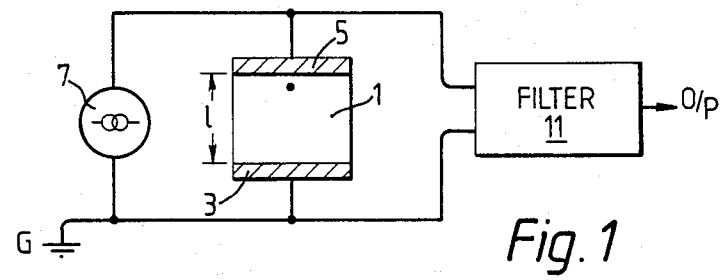
FIG. 1: is a schematic illustration of detector apparatus, the detector included in this apparatus having a single photoconductive element.
Figure 5:
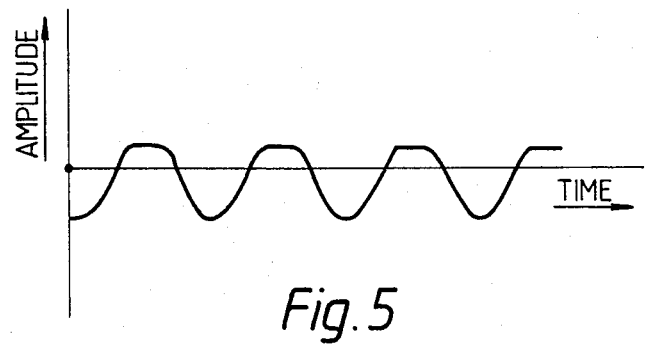

An embodiment of the invention will now be described, by way of example only, with reference to the drawings. The detector apparatus shown in FIG. 1 comprises a single element photoconductive detector 1, the element being of rectangular form. This element is of n-type cadmium mercury telluride material, suitable as a detector of infra-red radiation in the 8 to 14$\mu$ window band of the electromagnetic spectrum and having a sensitivity peaked at about 10$\mu$ wavelength. The element is of conventional size, approximately 50$\mu$ square between gold metal contacts 3 and 5. The resistance of the element lies between 30 and 40 ohms. The element contacts are connected to a high impedance current bias source 7 which provides alternating current bias at a finite DC level. Since the source is of high impedance, both AC peak amplitude and DC bias level are relatively insensitive to changes of element impedance. Signal voltage developed across the biassed element is relayed to an output filter 11, which serves to extract the photoresponse signal component of the output signal voltage at a frequency other than the bias frequency.

For operation, the detector 1 is cooled to liquid nitrogen temperature and is located at the image plane of an optical assembly (not shown).

Figure 4:
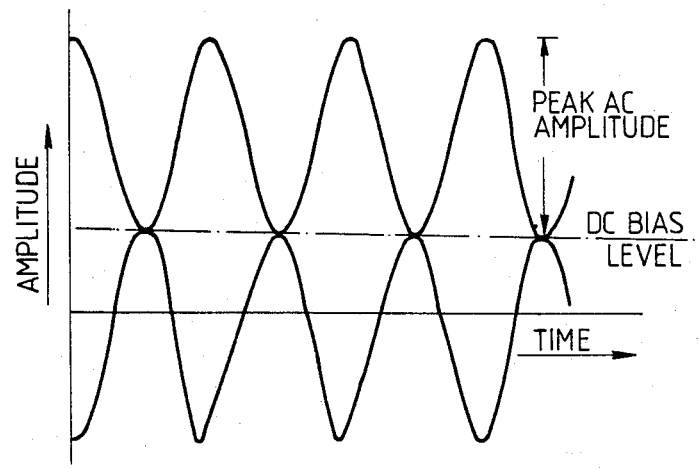

To give reasonable photoresponse signal output at a modest peak power level the DC level is set at approximately 2.0 mA magnitude and the AC peak amplitude a factor 3.0 times higher, at 6.0 mA peak. The alternating bias current frequency, which is not critical, is chosen as 10 kHz and this alternating bias is amplitude modulated at somewhat lower frequency, a modulation frequency of approximately 1 kHz. To give the largest demodulated signal output, the modulation is set at 100%. The waveform of this alternating bias is shown in FIG. 4.

Figure 2:
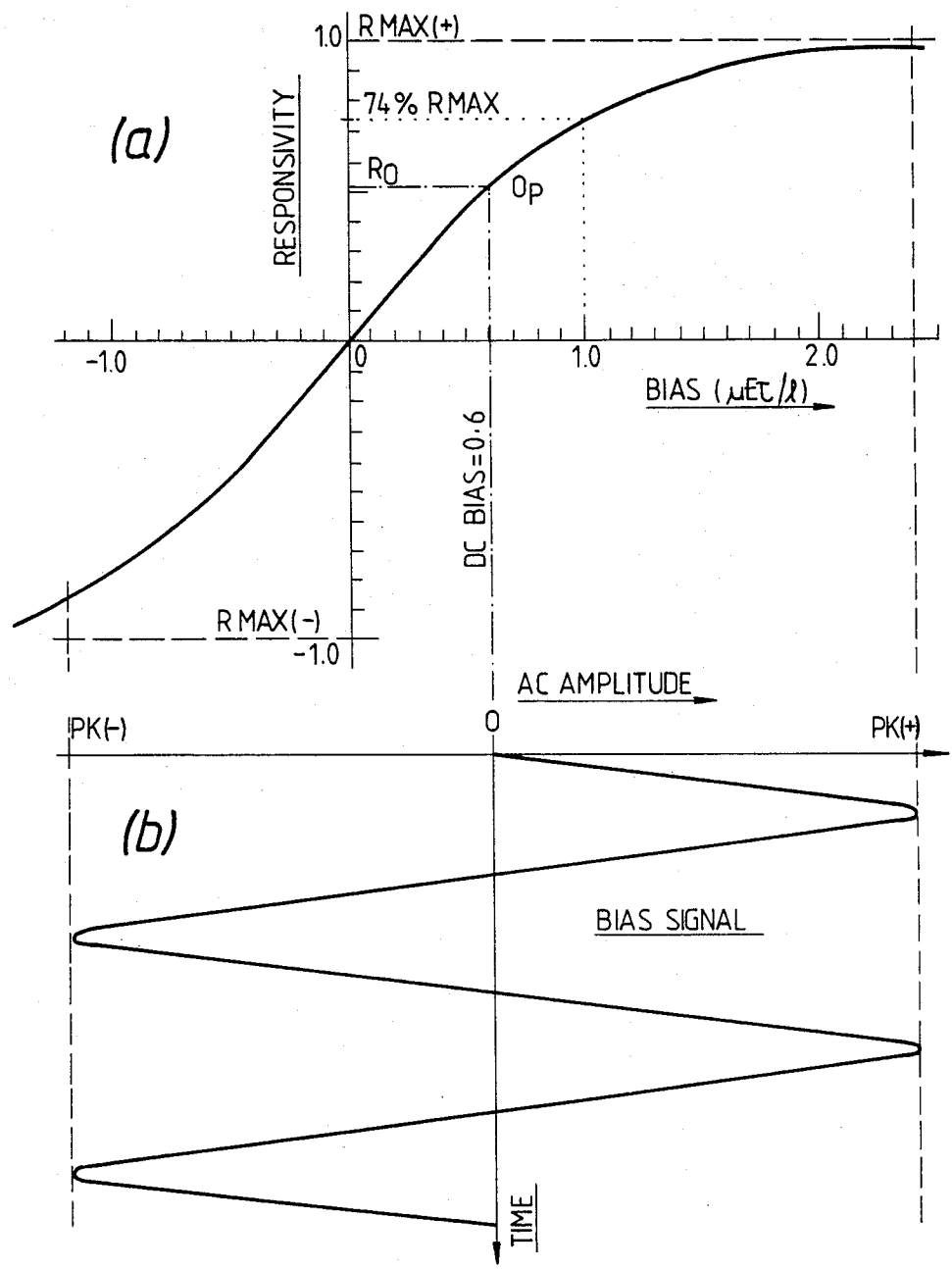
FIG. 2: is a graph showing element responsivity as a function of applied bias level.

The responsivity characteristic curve of the element is shown in FIG. 2. As can be seen from this characteristic curve, at low values of the bias field, the responsivity magnitude increases linearly with increasing magnitude of bias. This linear region corresponds to a regime where photocarrier recombination in the material bulk predominates. However as the bias field is increased to higher values, photocarriers recombine at the bias contact and this loss mechanism begins to predominate. The responsivity increase becomes less pronounced and a saturation value of the responsivity, $R_{max}$, is approached asymptotically. Over this region the characteristic curve is markedly non-linear. It is also noted that the response characteristic curve has a symmetry (in fact it is anti-symmetric) about the axes centre O, the point of zero bias.

The bias level of 2.0 mA corresponds to the point $O_p$ marked on the curve, this corresponding to a bias field E of 0.6 times the sweep-out field value $E_o$ $$E = 0.6 E_o; \ \mu E_o \tau / l = 1 \tag{5}$$

About this operation point $O_p$, the alternating bias current swings between a maximum positive excursion +0.8 mA ($\mu E \tau / l = 2.4$) and a maximum negative excursion −4.0 mA ($\mu E \tau / l = -1.2$). In the absence of illumination, the detector appears as a simple constant resistance. In the presence of illumination, the resultant output signal shows a significant degree of distortion due to the saturation of the responsivity to radiation at high bias levels. There is a partial rectification corresponding to a demodulation of the bias and the demodulation signal can then be removed by AC coupling, further filtered to extract a signal varying at the modulation frequency, and rectified to give a DC output level proportional to incident illumination intensities.

Figure 3:
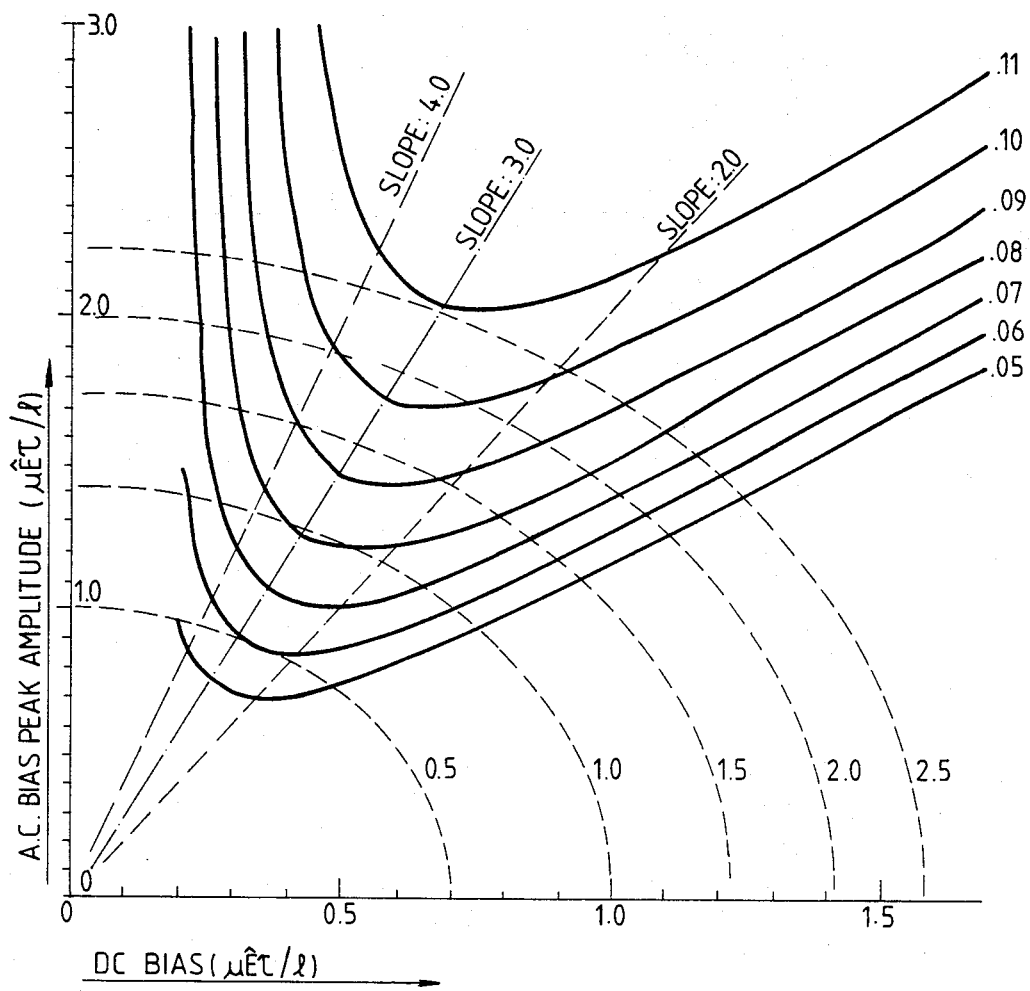
FIG. 3: is a graph showing the relationship between AC bias peak amplitude and DC bias level for constant signal peak amplitude and constant peak envelope power; and, FIGS. 4 and 5: are illustrations of modulated bias and filtered demodulated photoresponse signal waveforms, respectively.

The criteria for choosing the point of operation and peak AC bias magnitude can be ascertained from FIG. 3. Contours are drawn for different parameter values of output signal peak amplitude: factors $0.05 A_s$, $0.06 A_s$, ... $0.11 A_s$, have been calculated for an ideal detector, where $A_s$ is defined as twice the signal strength ($0.5 A_s$) for a detector which is fully swept, i.e. which has saturated responsivity. For comparison with a conventional DC biased detector, $0.5 A_s$ is taken as the photoresponse signal amplitude for unit intensity of radiation for a DC bias field $E_o$ ($\mu E_o \tau / l = 1$) applied to the same detector for which the signal is $0.37 A_s$ in the same units). These are shown in bold outline. Contours are also shown for different parameter values of peak envelope power: $0.5 P_o$, $1.0 P_o$, ..., $2.5 P_o$, where $P_o$ is power dissipated at the DC bias $E_o$. Power contours are shown in broken outline.

As can be seen from FIG. 3, for a given value of signal amplitude, the minimum of peak envelope power is dissipated for a bias of AC peak magnitude a factor of approx 3.0 times the value of DC bias, as illustrated by the trace line of slope =3.0. The peak envelope power increases only marginally for factors between say 2.0 and 4.0 as shown by the bounding lines slope 2.0 and 4.0. The operating point x (DC=0.6, AC=1.8) is shown. This corresponds to a signal amplitude a little in excess of $0.1 A_s$, a peak power of $1.0 P_o$, and mean $0.9 P_o$. Thus, for these conditions the mean power demand is a little less than $P_o$. However, it is the value of peak envelope power, and in particular of peak power heating, that limits operation to below high values of DC bias. Thus, to confine operation within reasonable bounds, at least from the figure, it appears that the DC bias field is best limited to a field value $0.7 E_o$ maximum to avoid excessive peak power dissipation, and to a field value $0.5 E_o$ minimum (not so critical) to achieve reasonable signal amplitude.

The contours illustrated have been drawn for an ideal element and no account has been taken of contact resistance or other factors. In practice, therefore, the limits given may require modification and optimization.

AC or DC signal back-off, as appropriate, may be used to set the level of the demodulated signal. It may be chosen to provide zero signal level for background illumination, and thus as a means of enhancing image signal contrast and allowing more effective use of following amplifiers.

We claim:

1. A method of biasing a photoconductive detector comprising the steps of:
   detecting photon radiation with at least one photoconductive element which has a bias versus responsivity curve including linear and non-linear portions and which has a photocarrier lifetime and which generates output signals;
   generating a bias having an alternating and a D.C. component, and providing a peak amplitude sufficient to drive operation of said photoconductive element into said non-linear portion of said bias versus responsivity curve, said alternating component having a cycle longer than said photocarrier lifetime; and
   processing said output signals to produce a photoresponse signal frequency component arising from said non-linear portion of said bias versus responsivity curve, and having a frequency different than the frequency of said alternating component.

2. A method according to claim 1 wherein said processing step includes filtering said photoresponse signal to indicate a D.C. component.

3. A method according to claim 2 wherein said bias generating step includes generating a DC bias component producing a bias field E in the range $0.5 E_o \leq E \leq 0.7 E_o$, where $E_o = l / \mu_a \tau$, where: l=element intercontact length; $\mu_a$=photocarrier ambipolar mobility; and $\tau$=natural photocarrier lifetime, and generating an AC bias component producing a peak AC bias field in the range of two to four times the DC bias field.

4. A method according to claim 1 wherein said processing step includes detecting a harmonic of said alternating bias component.

5. A method according to claim 4 wherein said step of detecting includes the step of phase detecting said harmonic.

6. A method according to claim 4 wherein said bias generating step includes generating a DC bias component producing a bis field E in the range $0.5 E_o \leq E \leq 0.7 E_o$, where $E_o = l / \mu_a \tau$, wherein: l=element intercontact length; $\mu_a$=photocarrier ambipolar mobility; and $\tau$=natural photocarrier lifetime, and generating an AC bias component producing a peak AC bias field in the range two to four times the DC bias field.

7. A method according to claim 5 wherein said bias generating step includes generating a DC bias component producing a bias field E in the range $0.5 E_o \leq E \leq 0.7 E_o$, where $E_o = l / \mu_a \tau$, where: l=element intercontact length; $\mu_a$=photocarrier ambipolar mobility; and $\tau$=natural photocarrier lifetime, and generating an AC bias component producing a peak AC bias field in the range of two to four times the DC bias field.

8. A method according to claim 1 wherein said bias generating step includes generating of an amplitude modulated alternating bias component, and wherein said processing step includes filtering said alternating bias component, and transmitting said amplitude modulation of said alternating bias component.

9. A method according to claim 8 wherein said bias generating step includes generating a DC bias component producing a bias field E in the range $0.5 E_o \leq E \leq 0.7 E_o$, where $E_o = l / \mu_a \tau$, where: l=element intercontact length; $\mu_a$=photocarrier ambipolar mobility; and $\tau$=natural photocarrier lifetime, and generating an AC bias component producing a peak AC bias field in the range of two to four times the DC bias field.

10. A method according to claim 1 wherein said bias generating step includes generating a DC bias component producing a bias field E in the range $0.5E_o \leq E \leq 0.7E_o$, where $E_o = l/\mu_a\tau$, where: $l$ = element intercontact length; $\mu_a$ = photocarrier ambipolar mobility; and $\tau$ = natural photocarrier lifetime, and generating an AC bias component producing a peak AC bias field in the range of two to four times the DC bias field.

11. A photosensitive detector apparatus, comprising:
   detector means for detecting photon radiation and generating output signals, said detector means including at least one photoconductive element which has a bias versus responsivity curve including linear and non-linear portions and which has a photocarrier lifetime;
   bias source means, connected to said detector means, for generating a bias having an alternating and a D.C. component, and providing a peak amplitude sufficient to drive operation of said photoconductive element into said non-linear portion of said bias versus responsivity curve, said alternating component having a cycle longer than said photocarrier lifetime; and
   output means for processing said output signals to generate a photoresponse signal frequency component arising from said non-linear portion of said bias versus responsivity curve, and having a frequency different than the frequency of said alternating component.

12. A detector apparatus according to claim 11 wherein said output means includes a filter for indicating a zero frequency or DC component of said photoresponse signal.

13. A detector apparatus according to claim 12 wherein said bias source means generates a DC bias component producing a bias field E in the range $0.5E_o \leq E \leq 0.7E_o$, where $E_o = l/\mu_a\tau$, where: $l$ = element intercontact length; $\mu_a$ = photocarrier ambipolar mobility; and $\tau$ = natural photocarrier lifetime, and wherein said bias source means generates an AC bias component producing a peak AC bias field in the range of two to four times the DC bias field.

14. A detector apparatus according to claim 11 wherein said output means includes means for detecting a harmonic of said alternating bias component.

15. A detector apparatus according to claim 14 wherein said detecting means includes phase sensitive detector means for detecting said harmonic.

16. A detector apparatus according to claim 14 wherein said bias source means generates a DC bias component producing a bias field E in the range $0.5E_o \leq E \leq 0.7E_o$, where $E_o = l/\mu_a\tau$, where: $l$ = element intercontact length; $\mu_a$ = photocarrier ambipolar mobility; and $\tau$ = natural photocarrier lifetime, and wherein said bias source means generates an AC bias component producing a peak AC bias field in the range of two to four times the DC bias field.

17. A detector apparatus according to claim 15 wherein said bias source means generates a DC bias component producing a bias field E in the range $0.5E_o \leq E \leq 0.7E_o$, where $E_o = l/\mu_a\tau$, where: $l$ = element intercontact length; $\mu_a$ = photocarrier ambipolar mobility; and $\tau$ = natural photocarrier lifetime, and wherein said bias source means generates an AC bias component producing a peak AC bias field in the range of two to four times the DC bias field.

18. A detector apparatus according to claim 11 wherein said bias source means includes means for generating an amplitude modulated alternating bias component, and wherein said output means includes a low pass filter for attenuating said alternating bias component and transmitting said amplitude modulated alternating bias component.

19. A detector apparatus according to claim 18 wherein said bias source means generates a DC bias component producing a bias field E in the range $0.5E_o \leq E \leq 0.7E_o$, where $E_o = l/\mu_a\tau$, where: $l$ = element intercontact length; $\mu_a$ = photocarrier ambipolar mobility; and $\tau$ = natural photocarrier lifetime, and wherein said bias source means generates an AC bias component producing a peak AC bias field in the range of two to four times the DC bias field.

20. A detector apparatus according to claim 11 wherein said bias source means generates a DC bias component producing a bias field E in the range $0.5E_o \leq E \leq 0.7E_o$, where $E_o = l/\mu_a\tau$, where: $l$ = element intercontact length; $\mu_a$ = photocarrier ambipolar mobility; and $\tau$ = natural photocarrier lifetime, and wherein said bias source means generates an AC bias component producing a peak AC bias field in the range of two to four times the DC bias field.

* * * * *